United States Patent [19]

Nakano et al.

[11] 4,443,714

[45] Apr. 17, 1984

[54] SEMICONDUCTOR BUFFER CIRCUIT HAVING COMPENSATION FOR POWER SOURCE FLUCTUATION

[75] Inventors: Tomio Nakano, Kawasaki; Yoshihiro Takemae, Yokohama, both of Japan

[73] Assignee: Fujitsu Limited, Kawasaki, Japan

[21] Appl. No.: 331,476

[22] Filed: Dec. 16, 1981

[30] Foreign Application Priority Data

Dec. 24, 1980 [JP] Japan ................................ 55-183075

[51] Int. Cl.³ .................. H03K 5/135; H03K 19/017; H03K 19/096
[52] U.S. Cl. .................................... 307/269; 307/578; 307/601
[58] Field of Search ................................ 307/481–482, 307/443, 491, 549–550, 577–578, 583–584, 264, 269, 591, 601, 605, 518

[56] References Cited

U.S. PATENT DOCUMENTS

| | | | |
|---|---|---|---|
| 3,927,334 | 12/1975 | Callahan | 307/482 X |
| 4,061,933 | 12/1977 | Schroeder et al. | 307/481 X |
| 4,317,051 | 2/1982 | Young, Jr. | 307/578 X |
| 4,339,672 | 7/1982 | Sato | 307/482 X |
| 4,379,974 | 4/1983 | Plachno | 307/578 X |

*Primary Examiner*—Larry N. Anagnos
*Assistant Examiner*—David R. Hudspeth
*Attorney, Agent, or Firm*—Staas & Halsey

[57] ABSTRACT

A semiconductor circuit, used as a buffer circuit, has an input stage circuit for receiving an input clock signal and an inverted input clock signal, a bootstrap circuit, including a transistor for receiving the output of the input stage circuit and for maintaining the gate voltage of the transistor at a high level during a standby period, and an output circuit, including a transistor which is switched on and off by the output of the bootstrap circuit. The input stage circuit generates an output clock signal. The semiconductor circuit further comprises a circuit for applying a high level clock signal, having the same phase as the inverted clock sigal and a level higher than the level of the sum of a power source upper limit voltage and a transistor threshold voltage, to transistor gates, whereby the voltage of a point charged during the standby period corresponds to the voltage of the power source throughout the standby period. Thus, delay in the output clock signal, which is the cause of fluctuation of the voltage of the power supply during the standby period, is reduced and high speed access time in the dynamic memory device is accomplished.

6 Claims, 10 Drawing Figures

SEMICONDUCTOR BUFFER CIRCUIT HAVING COMPENSATION FOR POWER SOURCE FLUCTUATION

BACKGROUND OF THE INVENTION

1. Field of the Invention

The present invention relates, for example, to a semiconductor circuit used as a buffer circuit having the function of compensating for a power source fluctuation and used for the amplification of a clock signal in a dynamic memory device.

2. Description of the Prior Art

A conventional buffer circuit which amplifies an input clock signal $\phi_0$ (conversion of impedance) and supplies an output clock signal $\phi_1$ comprises MOS transistors Q1 through Q12 (Q9 is a MOS capacitor), as shown in FIG. 1. The input stage of the buffer circuit is a delay circuit comprising transistors Q1 through Q4. During a standby period, the delay circuit holds the voltage of the node N2, which connects the source of transistor Q3 with the drain of transistor Q4, at a high level. This is possible because of the input clock signal $\phi_0$ and the inverted input clock signal $\overline{\phi_0}$. The clock signal $\phi_0$ is at a high level during an active period and is at a low level during the standby period. The clock signal $\overline{\phi_0}$, because of the inverted polarity, is at a low level during the active period and is at a high level during the standby period. During the stand-by period these clock signals turn off the transistor Q1, turn on the transistors Q2 and Q3, hold the node N1 which connects the source of the transistor Q1 with the drain of the transistor Q2 and the gate of the transistor Q4, at a low level, turn off the transistor Q4, and charge the node N2 to the voltage of (Vcc−Vth) through the transistor Q3. Vcc is the voltage on the high voltage side of the power source and is usually 5 volts, which is the standard value, allowing for an error of ±10%. Vth is a threshold value of the transistor. Since the gate of the transistor Q5 is connected to the power source Vcc, when the node N2 is charged to (Vcc−Vth) the node N3 is charged to the same voltage. The node N3, which connects the transistor Q5 with the gate of transistor Q6, is the gate terminal of the transistor Q6 in the bootstrap circuit including the transistors Q5, Q6 and Q7. By charging the node N3 to a high level during the standby period, the charged voltage of the node N3 drives, at a high speed, the output stage including the transistors Q8 through Q12 during the next active period. Since the clock signal $\overline{\phi_0}$ is at a high level during the standby period, the transistor Q7 turns on, the node N4, which connects the source of transistor Q6 with the drain of the transistor Q7, the MOS capacitor Q9, and the gate of transistor Q11, reaches a low level. In addition the transistors Q8 and Q11 turn off, the transistors Q10 and Q12 turn on, and the output clock signal $\phi_1$ is at a low level which is equal to the low voltage side of the power source Vss (usually ground voltage).

At the start of the active period, the input clock signals $\phi_0$ and $\overline{\phi_0}$ are inverted. In FIG. 2, waveforms are shown during the active period. This example shows a constant Vcc which is equal to 4.5 volts. Although, in this example, the voltage of the node N2 is equal to the voltage of the node N3 (4.5 volts−Vth) at the end of the standby period, when the clock signal $\phi_0$ changes from Vcc to Vss and the clock signal $\overline{\phi_0}$ changes from Vss to Vcc, the voltage of the node N3 increases to more than (Vcc+Vth) and the voltage of the node N4 is charged to the voltage of $\phi_0$, which is equal to Vcc, by means of the bootstrap effect. This bootstrap effect is due to the effects of the capacity between the gate and the drain of the transistor Q6 and between the gate and the source of the transistor Q6.

This results in the transistors Q8 and Q11 being turned on. At the same time, since the transistor Q1 turns on, the transistor Q2 turns off, and the node N1 is charged to a voltage of Vcc; then the transistor Q4 turns on and the voltage of the node N2 begins to decrease. Accordingly, the electric charges at the node N3 are attracted by the voltage of node N2 through the transistor Q5 and the voltage of the nodes N3 and N2 decreases to Vss. When the voltage of the node N2 decreases to (Vss+Vth), the transistors Q10 and Q12 turn off and the voltage of the node N5 increases to Vcc. At this time, since the voltage of the node N3 is Vss, the transistor Q6 turns off, the voltage of the node N4 is increased to more than (Vcc+Vth) through the capacitor Q9, and the output clock signal $\phi_1$ increases to the maximum power source voltage level Vcc.

The above-mentioned operation is carried out when no fluctuation of the power source occurs. However, if fluctuation of the power source occurs during the standby period, as shown in FIG. 3, the output clock signal $\phi_1$ is delayed, and delay of the output clock signal $\phi_1$ signifies a problem. In FIG. 3 an example is shown in which the Vcc decreases from 5.5 volts (Vcc(U)) to 4.5 volts (Vcc(L)) during the standby period. The above-mentioned fluctuation occurs when the electrical constitution of the constant voltage power supply is simplified in order to reduce the cost of the device or when other devices connected to the same power source are operated. During the standby period, the voltage of the clock signal $\phi_0$ is low, the voltage of the clock signal $\overline{\phi_0}$ is high and the voltage of Vcc is the upper limit Vcc(U), which is equal to 5.5 volts, causing both the nodes N2 and N3 to be charged to (5.5 volts-Vth). Further, if Vcc decreases to the lower limit Vcc(L) which is equal to 4.5 volts, during the standby period, the voltage of the nodes N2 and N3 (5.5 volts−Vth) does not change because there is no discharge path. The reason there is no discharge path is that the transistor Q4 is in the "off" state, and the gate of the transistor Q3 has a low voltage of 4.5 volts which is equal to $\phi_0$ and Vcc. When the voltage of the nodes N2 and N3 is held, the clock signal $\phi_1$ is delayed. In order to increase the clock signal $\phi_1$, it is necessary that the transistors Q10 and Q12 be turned off; on the other hand, it takes time for the voltage of the node N2 to decrease to the low level (Vss+Vth) at which the transistors Q10 and Q12 are turned off because the initial voltage of the node N2 is (5.5 volts−Vth), that is, it is 1 volt higher than the voltage (4.5 volts−Vth) in FIG. 2. During the period of delay when the voltage is decreasing at the node N2, a delay in the clock signal $\phi_1$ occurs. In FIG. 3 the waveforms indicated by the broken lines N2′, N3′, N5′ and $\phi_1$′ show the passages of the voltage changes at the nodes N2, N3 and N5 and the voltage of the clock signal $\phi_1$ without a power source fluctuation, as compared with the solid lines N2, N3, N5 and $\phi_1$ which show the passages of the voltage changes at the nodes N2, N3 and N5 when fluctuation occurs in the power supply.

The prior art regarding the above-mentioned method is disclosed in U.S. Pat. No. 4,061,933.

The present invention is proposed in order to minimize the above-mentioned problems.

SUMMARY OF THE INVENTION

The object of the present invention is to provide a semiconductor circuit used as a buffer circuit in which the voltage of the charged nodes during the standby period corresponds to the voltage of the power source throughout the standby period, thereby improving the delay in the output clock signal caused by fluctuation of the voltage of the power supply, and accomplishing high speed access time in a dynamic memory device.

According to one aspect of the present invention, there is provided a semiconductor circuit, used as a buffer circuit, comprising an input stage circuit for receiving an input clock signal and an inverted input clock signal, a bootstrap circuit, comprising a transistor, for receiving the output of the input stage circuit and for maintaining the gate voltage of the transistor at a high level during a standby period, and an output circuit comprising a transistor, which is switched on and off by the output of the bootstrap circuit and the input stage circuit, for generating an output clock signal. The semiconductor circuit further comprises a means for applying a high level clock signal, having the same phase as the inverted clock signal and a level higher than the level of the sum of a power source voltage and a transistor threshold voltage, to a gate of a predetermined transistor, whereby the voltage of a point charged during the standby period corresponds to the voltage of the power source throughout the standby period.

According to another aspect of the present invention, there is provided a semicondutor circuit, used as a buffer circuit, comprising an input stage delay circuit for receiving an input clock signal and an inverted input clock signal, a bootstrap circuit for receiving the output of the input stage delay circuit and for increasing the voltage of an output by means of a bootstrap operation, and an output circuit for receiving the output of the bootstrap circuit and the input stage delay circuit and for generating an output clock signal. The semiconductor circuit further comprises a means for applying a high level clock signal, having the same phase as the inverted clock signal and a level higher than the level of the sum of a power source voltage and a transistor threshold voltage, to a gate of a transistor for connecting a first node connecting the output of the input stage delay circuit with the input of the bootstrap circuit with one of the output terminals of the power source, whereby the voltage of the first node corresponds to the power source throughout the standby period.

According to still another aspect of the present invention, there is provided a semiconductor circuit, used as a buffer circuit, comprising an input stage delay circuit for receiving an input clock signal and an inverted input clock signal, a bootstrap circuit for receiving the output of the input stage delay circuit and for increasing the voltage of an output by means of a bootstrap operation, the bootstrap circuit comprising at least two transistors in a first stage and a transistor in a second stage, and an output circuit for receiving the output of the bootstrap circuit and the input stage delay circuit and for generating an output clock signal. The semiconductor circuit further comprises a means for applying a high level clock signal, having the same phase as the inverted clock signal and a level higher than the level of the sum of a power source voltage and a transistor threshold voltage, to the gate of the transistor for connecting the first node connecting the output of the input stage delay circuit with the input of the bootstrap circuit, with one of the output terminals of the power source, and another means for applying the high level clock signal to the gate of the transistor for connecting the third node connecting the two transistors in the first stage with the transistor in the second stage, with one of the output terminals of the power source, whereby the voltage of the first node and the third node corresponds to the power source throughout the standby period.

DESCRIPTION OF THE PREFERRED EMBODIMENTS

Figure 1:
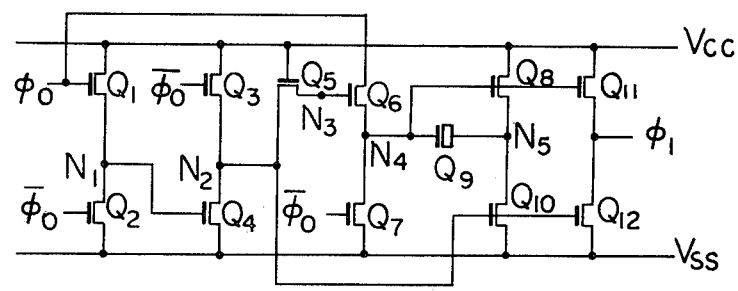
FIG. 1 is a circuit diagram of an example of a conventional clock signal amplifier circuit.
Figure 4:
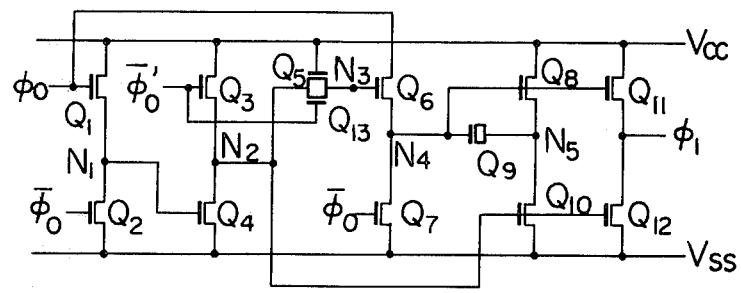
FIG. 4 is a circuit diagram of a semiconductor circuit used as a buffer circuit according to a first embodiment of the present invention.
Figure 5:
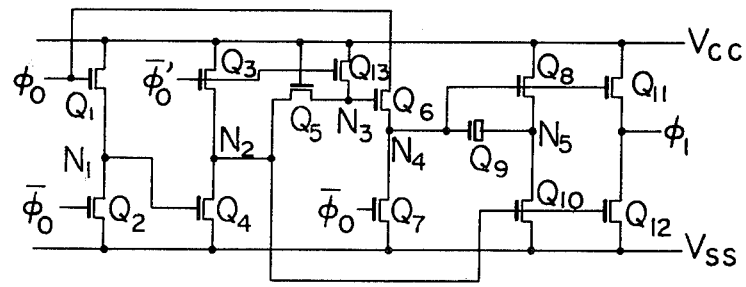
FIG. 5 is a circuit diagram of a semiconductor circuit used as a buffer circuit according to a second embodiment of the present invention.
Figure 2:
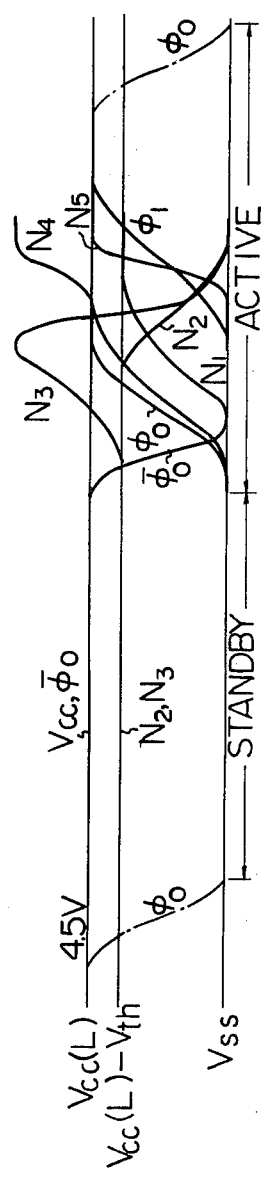
FIG. 2 and FIG. 3 are waveform diagrams for the circuit of FIG. 1.
Figure 3:
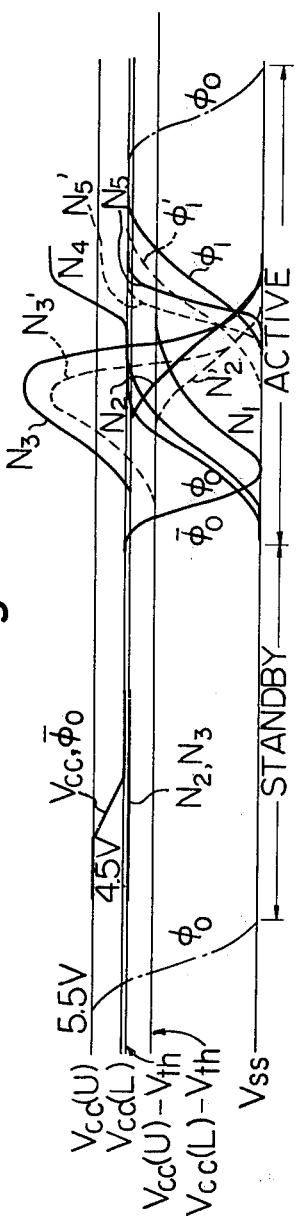

In FIG. 4 and FIG. 5, circuit diagrams of a semiconductor circuit used as a buffer circuit are shown, according to a first embodiment and a second embodiment of the present invention, respectively. In the Figures the same elements as those in the circuit of FIG. 1 are referred to by the same reference numbers as in FIG. 1. There are two ways in which the above-mentioned circuits of the embodiments differ from the circuit of FIG. 1. First, a high level clock signal $\overline{\phi_0}'$ which is the same phase as the inverted clock signal $\overline{\phi_0}$ and the high level of which is higher than the level of the sum of the power source voltage Vcc and the transistor threshold voltage Vth, is applied to the gate of the transistor Q3 through which the node N2 is charged in an input stage circuit during the standby period. Second, another transistor Q13, to the gate of which the high level clock signal is similarly applied, is connected between the node N2 and the node N3 as shown in FIG. 4, or between one of the output terminals of the power source Vcc and the node N3 as shown in FIG. 5. The other circuitry is the same as that of FIG. 1 and therefore explanations regarding these portions are abbreviated. In these embodiments, the node $N_2$ is referred to as the first node and the node $N_3$ is referred to as the second node.

Figure 6:
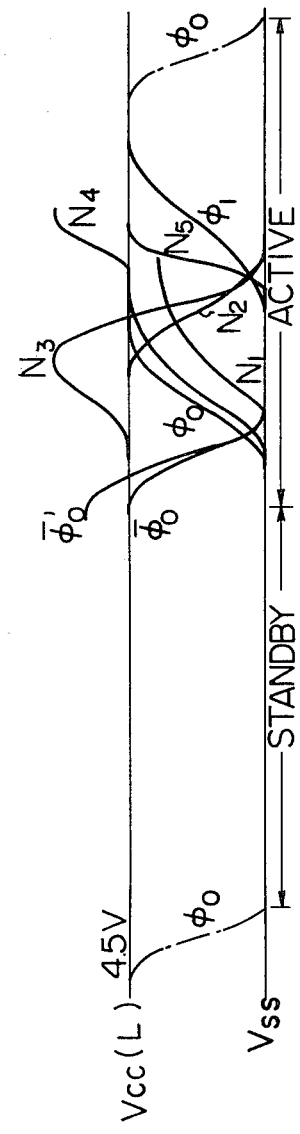
FIG. 6 and FIG. 7 are waveform diagrams for the circuits of FIG. 4 and FIG. 5, respectively.
Figure 7:
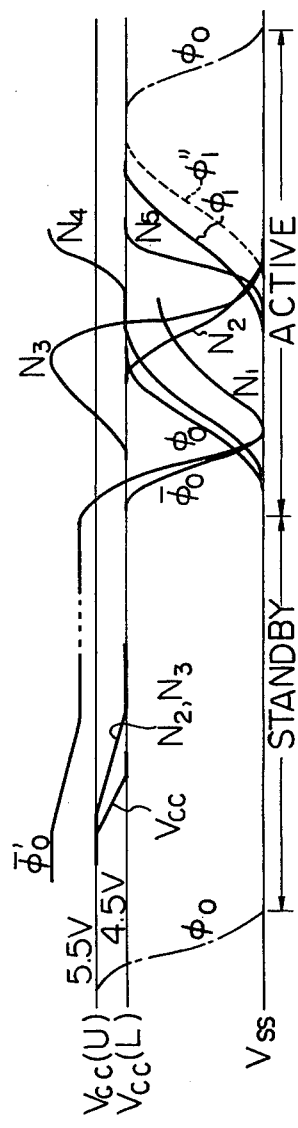

When the high level clock signal $\overline{\phi_0}'$, the high level of which is greater than (Vcc+Vth), is applied to the gate of the transistor Q3, the voltage of the node N2 corresponds to Vcc during the standby period. Therefore, in the case in which Vcc is constantly 4.5 volts, as shown in FIG. 6, or in the case in which Vcc decreases from 5.5 volts to 4.5 volts during the standby period, as shown in FIG. 7, the active period begins when the voltage of N2 is equal to 4.5 volts. Namely, if the voltage of N2 is charged to 5.5 volts when the Vcc is 5.5 volts, the charges at the node N2 can discharge to the side of the Vcc line through the transistor Q3 when Vcc decreases to 4.5 volts, resulting in a decrease in the voltage of the node N2 to 4.5 volts. Accordingly, the voltage of the node N2, which voltage turns off the transistors Q10 and Q12 in the output stage during the active period, is defined according to Vcc at the end of the standby period, whether fluctuation of the power source occurs or not. Therefore, there is no difference in the voltage change between the node N2 in FIG. 6 and the node N2 in FIG. 7 during the active period. The factor responsible for delay of the clock signal $\phi_1$ in the case of FIG. 7, as compared with FIG. 6, is improved. The effect is further emphasized by the addition of transistor Q13 so that the voltage of the node N3 also corresponds to Vcc. In these embodiments, since the node N2 is charged at a high level, as much as Vth higher than the voltage of the node N2 in FIG. 1, the channel width of the transistor Q4 must be increased so as to decrease the discharge time. The broken line $\phi_1''$ in FIG. 7 shows the delay of the clock signal $\phi_1$ when a conventional circuit is used.

Figure 8:
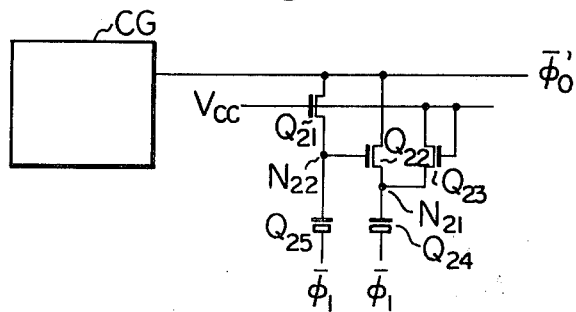
FIG. 8 is a circuit diagram of an example of a high level clock signal generator, the output of which is used at the circuits according to the embodiments of the present invention.
Figure 9:
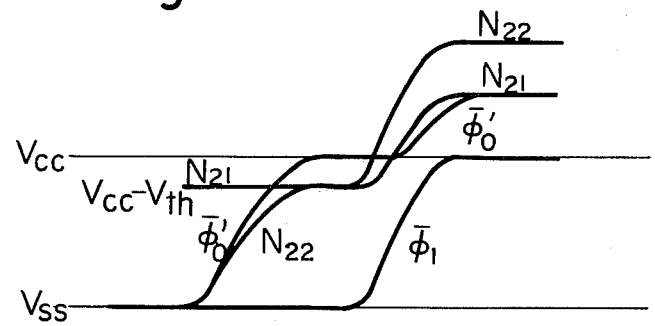
FIG. 9 is a waveform diagram of the high level clock generating circuit in FIG. 8.

In FIG. 8 an example of the high level clock signal $\overline{\phi}_0'$ generating circuit is shown, and in FIG. 9 the waveforms for each of the portions operating in the circuit are shown. In FIG. 8 a clock generator CG generates a clock signal which has the same phase as the clock signal $\overline{\phi}_1$ corresponding to the inverted signal of the clock signal $\phi_1$ and has an amplitude of from Vss to Vcc. The above-mentioned generated clock signal is shown as a curve $\overline{\phi}_0'$ below the Vcc line in FIG. 9. The transistor Q23 always charges the node N21 to the (Vcc−Vth). While clock signal $\overline{\phi}_0'$ increases to Vcc, the node N22 is charged to (Vcc−Vth), and after the clock signal $\overline{\phi}_0'$ increases to Vcc, the clock signal $\overline{\phi}_1$ increases to the Vcc; then voltage of the node N21 is increased through the capacitor Q24. Further, by the bootstrap effect caused by means of the capacitor Q25, the voltage of the node N22 is increased; then the transistor Q22 turns on sufficiently, the charges at the node N21 are discharged to the output side, and the high level clock signal $\overline{\phi}_0'$ is amplified to more than (Vcc+Vth).

Figure 10:
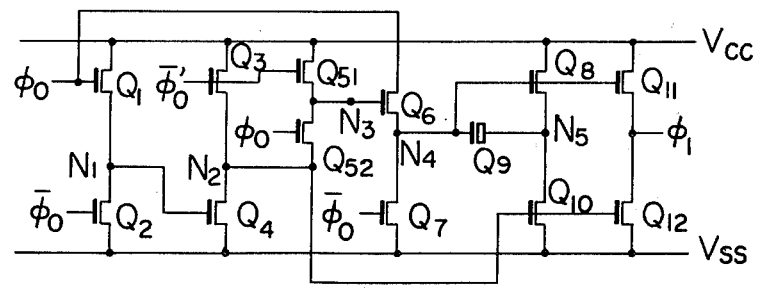
FIG. 10 is a circuit diagram of a semiconductor circuit used as a buffer circuit according to a third embodiment of the present invention.

In FIG. 10, a third embodiment of the present invention is shown. In the circuit of this embodiment, the transistor Q5 in FIG. 1 is replaced with two transistors Q51 and Q52. In this circuit, the inverted clock signal $\overline{\phi}_0$, the high level of which is Vcc, is usually applied to the gates of transistors Q3 and Q51. Accordingly, since the inverted clock signal $\overline{\phi}_0$ is at a high level during the standby period, the transistor Q3 turns on, the voltage of the node N2 is equal to (Vcc−Vth), the transistor Q51 turns on, and the voltage of the node N3 is equal to (Vcc−Vth). While the clock signal $\phi_0$ is at a low level, the transistor Q52 is turned off and the node N2 is electrically separated from the node N3. During the active period, the clock signal $\phi_0$ is at a high level and the transistor Q52 turned on, and an operation similar to that shown in FIG. 1 is carried out. When Vcc fluctuates before the active period, similar in operation to that shown in FIG. 1, the voltage of the nodes N2 and N3 remains excessively high.

In this embodiment, the above-mentioned high level clock signal $\overline{\phi}_0'$, the high level of which is more than (Vcc+Vth), is applied to the gates of the transistors Q3 and Q51, and, similarly to the first and the second embodiments, the voltage of the nodes N2 and N3 (the first node and the third node) corresponds to Vcc during the standby period. In this semiconductor circuit used as a buffer circuit, the transistor Q13 in FIGS. 4 and 5 is not necessary; nevertheless, the operation waveforms are similar to the waveforms in FIGS. 6 and 7.

We claim:

1. A semiconductor circuit, used as a buffer circuit and operatively connectable to a power source voltage and to receive an input clock signal, having first and second levels, and an inverted input clock signal, comprising:

an input stage circuit for receiving the input clock signal and the inverted input clock signal, and for generating an output signal at a node, said input stage circuit including a first field effect transistor, having a gate, for charging up said node via its drain-source current path and maintaining the node at a predetermined voltage during a standby period in which the input clock signal is at the first level;

a bootstrap circuit comprising a second field effect transistor operatively connected to said node, for receiving the output signal of said input stage circuit, said bootstrap circuit generating a boosted signal in response to the output signal of said input stage circuit; and an output circuit, comprising a third field effect transistor operatively connected to said bootstrap circuit, for receiving the boosted signal and for generating an output clock signal;

means for applying a high level clock signal, having the same phase as the inverted clock signal and a level higher than the level of the sum of the power source voltage and the threshold voltage of said first field effect transistor, to the gate of said first field effect transistor, so that, during the standby period, the predetermined voltage of said node is maintained at a level corresponding to the power source voltage by leaking excessive charges at said node through said first field effect transistor to lower the voltage level of said node.

2. A semiconductor circuit, used as a buffer circuit and operatively connectable to a power source voltage and to receive an input clock signal, having first and second levels, and an inverted input clock signal, comprising:

an input stage delay circuit for receiving the input clock signal and the inverted input clock signal, and for generating an output signal at a first node, said input stage delay circuit including a field effect transistor, operatively connected to said first node and the power source voltage via its drain-source current path, for charging up said first node and maintaining said first node at a predetermined voltage during a standby period in which the input clock signal is at the first level;

a bootstrap circuit, operatively connected to said input stage delay circuit at said first node, for receiving the output signal of said input stage delay circuit and for generating a boosted signal, said bootstrap circuit increasing the voltage of the boosted signal by means of a bootstrap operation;

an output circuit, operatively connected to said bootstrap circuit, for receiving the boosted signal and for generating an output clock signal;

means for applying a high level clock signal, having the same phase as the inverted clock signal and a level higher than the level of the sum of the power source voltage and the threshold voltage of said field effect transistor, to the gate of said field effect transistor, so that the predetermined voltage of said first node is maintained at a level corresponding to the power source voltage during the standby period by leaking excessive charges at said first node through said field effect transistor to lower the voltage level of said first node.

3. A semiconductor circuit as set forth in claim 2, wherein said bootstrap circuit comprises a first transistor and a second transistor connected to said first transistor at a second node, said semiconductor circuit further comprising a switching circuit operatively connected to said means for applying said high level clock signal and operatively connected between said first node and said second node, so that the predetermined voltage of said first node and the voltage of said second node both correspond to the power source voltage throughout the standby period.

4. A semiconductor circuit as set forth in claim 2, wherein said bootstrap circuit comprises a first transistor and a second transistor connected to said first transistor at a second node, said semiconductor circuit further comprising a switching circuit operatively connected to said means for applying said high level clock signal and operatively connected between said second node and the power source voltage, so that the predetermined voltage of said first node and the voltage of said second node both correspond to the power source voltage throughout the standby period.

5. A semiconductor circuit, used as a buffer circuit and operatively connected to a power source voltage and to receive an input clock signal, having first and second levels, and an inverted input clock signal, comprising:

an input stage delay circuit for receiving the input clock signal and the inverted input clock signal and for generating an output signal at a first node, said input stage delay circuit having an input field effect transistor connected to said first node via its drain-source current path, for charging said first node and maintaining said first node at a predetermined voltage during a standby period in which the input clock signal is at a first level;

a bootstrap circuit, operatively connected to said input stage delay circuit at said first node, for receiving the output signal of said input stage delay circuit and for generating a boosted signal, said bootstrap circuit increasing the voltage of the boosted signal by means of a bootstrap operation, said bootstrap circuit comprising first and second transistors connected in a first stage and a third transistor in a second stage, said third transistor connected to said first and second transistors at a second node via its drain-source current path, said first transistor being a field effect transistor;

an output circuit, operatively connected to said input stage delay circuit and to said bootstrap circuit, for receiving the boosted signal and the output signal and for generating an output clock signal;

means for applying a high level clock signal, having the same phase as the inverted clock signal and a level higher than the level of the sum of the power source voltage and the threshold voltage of said input field effect transistor, to the gate of said input field effect transistor; and means for applying the high level clock signal to the gate of said first transistor, so that the second node, connecting said first and second transistors in said first stage with said third transistor in said second stage, is connected to the power source voltage, so that the predetermined voltage of said first node and the voltage of said second node both correspond to the power source voltage throughout the standby period.

6. A semiconductor circuit as set forth in claims 3 or 4 wherein said switching circuit comprises a MIS transistor.

* * * * *

UNITED STATES PATENT AND TRADEMARK OFFICE
CERTIFICATE OF CORRECTION

PATENT NO. : 4,443,714

DATED : APRIL 17, 1984

INVENTOR(S) : TOMIO NAKANO ET AL.

It is certified that error appears in the above-identified patent and that said Letters Patent is hereby corrected as shown below:

Col. 1, line 31, after "NI" insert --,--.

Col. 2, line 28, delete "the".

Col. 5, line 33, delete "the" (second occurrence);
      line 37, delete "the" (first occurrence).

Signed and Sealed this

Twenty-ninth Day of January 1985

[SEAL]

Attest:

DONALD J. QUIGG

Attesting Officer     Acting Commissioner of Patents and Trademarks